United States Patent [19]

Freneuil et al.

[11] Patent Number: 5,562,505
[45] Date of Patent: Oct. 8, 1996

[54] ADAPTOR FOR A MACHINE FOR TESTING ELECTRONIC EQUIPMENT

[75] Inventors: Patrick Freneuil, Toulouse; Bernard Ginestet, Beauzelle; JoséOrtega, Toulouse, all of France

[73] Assignee: Societe Nationale Industrielle et Aerospatiale, Paris, France

[21] Appl. No.: 377,458

[22] Filed: Jan. 24, 1995

[30] Foreign Application Priority Data

Feb. 1, 1994 [FR] France ................................... 94 01064

[51] Int. Cl.$^6$ .................................................. H01R 25/00
[52] U.S. Cl. ...................... 439/638; 439/540.1; 439/573
[58] Field of Search ..................................... 439/928, 638, 439/654, 639, 540.1, 76, 297, 298, 912, 572, 573

[56] References Cited

U.S. PATENT DOCUMENTS

| 3,667,045 | 5/1972 | Combs | 439/912 |
|---|---|---|---|
| 3,711,817 | 1/1973 | Carter et al. | 439/540.1 |
| 4,605,270 | 8/1986 | Pavel | 439/540.1 |
| 5,340,340 | 8/1994 | Hastings et al. | 439/928 |

FOREIGN PATENT DOCUMENTS 0470303  2/1992  European Pat. Off. .

OTHER PUBLICATIONS

"Un Nouveau Standard En Test?", Mesures, vol. 53, No. 11, Oct. 17, 1988, Paris, France pp. 51, 53, 54, 57.
French Search Report (3 pages).

*Primary Examiner*—David L. Pirlot
*Attorney, Agent, or Firm*—Marshall, O'Toole, Gerstein, Murray & Borun

[57] ABSTRACT

The invention relates to an adaptor for a machine for testing electronic equipment, intended to serve as interface between the said machine and the said equipment and being presented in the form of an at least approximately rectangular box (7), the said adaptor (3) including:

first and second sets of electrical connectors (19, 24) arranged respectively on the front face (14) and on the rear face (16) of the said box in order to interact with complementary electrical connectors carried by the said equipment (2) and by the said machine (1);

electrical circuits housed in the said box (7) and establishing electrical links between the said sets of connectors; and a rigid frame (4), integral with the rear face of the said box and intended to interact with a mechanism (5, 6) provided on the said machine for fixing the said box onto the said machine by its rear face.

Advantageously, the said electrical connectors of the said second set are mounted in such a way as to be able to be put in place on the said box (7) and to be separated from the latter, through the said rigid frame (4).

9 Claims, 5 Drawing Sheets

ADAPTOR FOR A MACHINE FOR TESTING ELECTRONIC EQUIPMENT

The present invention relates to an adaptor for a machine for testing electronic equipment.

More particularly, although not exclusively, the equipment to be tested may be computers, sophisticated electronic measurement or analysis devices and the like which are, for example, mounted on board aircraft and which have to be checked in order to verify the operation thereof. This machine is designed as a test set making it possible to check the various equipment items to be tested via the adaptor. It goes without saying that all electronic equipment used in any technical field may be checked by a specific machine via an appropriate adaptor, in accordance with the invention.

Such adaptors, which then serve as interface between the various equipment items to be tested and the machine, are already known and, particularly in the aeronautical field, they must meet fairly precise standards, referenced ARINC-608A, so as to satisfy the technical requirements in force.

In general, the said adaptors are presented in the form of an at least approximately rectangular box, and include:
a first set of electrical connectors arranged on the front face of the said box and intended to interact with complementary electrical connectors carried by the said equipment;
a second set of electrical connectors arranged on the rear face of the said box and intended to interact with complementary electrical connectors carried by the said machine;
electrical circuits housed in the said box and establishing electrical links between the said first and second sets of connectors; and
a rigid frame, integral with the said box at the periphery of the rear face of the latter, and intended to interact with a mechanism provided on the said machine for removably fixing the said box onto the said machine, by its rear face.

Although they give satisfactory results from the functional point of view, it transpires that, from the structural point of view, the adaptors exhibit a few drawbacks, especially during maintenance operations relating in particular to the various circuits and electrical links between the two sets of connectors.

In fact, the connectors of the second set are fixed onto the front face of the frame (or onto the rear face of the box) in such a way that, when the box is secured, by its rear face, onto the front face of the frame, dismantling of the connectors proves to be awkward. In fact, they are then accessible only through the said box, by withdrawing the front face of the latter, which raises internal accessibility difficulties by reason of the numerous electrical links provided in the box of the adaptor and linking the various connectors of the said sets. That being so, the risks of damage to wires or connections are significant during dismantling of the connectors of the second set, all the more so since the said links, consisting of harnesses of electrical wire and of appropriate subassemblies, take up all the internal space of the said adaptor.

The object of the present invention is to remedy these drawbacks, and it relates to an adaptor for a machine for testing electronic equipment, the design of which greatly enhances the various maintenance operations on electrical circuits and on sets of connectors housed in the adaptor.

To this end, the said adaptor for a machine for testing electronic equipment, of the type described above, is noteworthy according to the invention in that the said electrical connectors of the said second set are mounted in such a way as to be able to be put in place on the said box and to be separated from the latter, through the said rigid frame.

Thus, by virtue of the invention, maintenance of these connectors of the second set, especially for the purposes of repairing their broken or twisted contacts, is facilitated since, after unlocking of the removable mechanism linking the machine to the frame of the adaptor, the said connectors are directly accessible from the rear face of the frame, without having to resort to opening the front face of the box.

Advantageously, the said electrical connectors of the second set are fixed onto the front face of the said rigid frame by fixing screws or the like, the heads of which are accessible from the rear face of the said frame. Hence, the maintenance operations relating to these connectors and to their electrical links are extremely easy since, after having unlocked the adaptor from the machine by acting on the mechanism, it is simply necessary to withdraw the said fixing screws in order to extract the connector or connectors concerned out of the box, through the frame, and then to carry on with the checks.

In a preferred embodiment, the said rigid frame consists of four struts assembled to one another and opposite in parallel pairs, the said connectors of the second set being applied at their ends against two of the said opposite struts of the said frame in order to be fixed there. In particular, the opposite struts of the frame, carrying the said connectors of the second group, are identical and are then provided with respective inner rims situated on the front face of the frame and turned towards one another, the said connectors being brought into abutment against the said inner rims from the rear face of the frame, in order to be fixed there. As for the other two opposite struts of the frame, also identical, they are provided, externally, with projecting anchoring bushes intended to interact with the said removable locking mechanism of the said machine.

Moreover, it is known that the locking mechanism, which is provided on the machine and with which the corresponding bushes of the frame interact, must guarantee exact fixing and effective holding of the adaptor onto the machine. However, it turns out that, in use, because of the frequent mounting and removal of the adaptor, the links of the mechanism with the bushes of the frame deteriorate, until unacceptable functional play is present, in such a way that it is then necessary to change the frame. This means separating the box from the said frame to be changed and, in order to do so, dismantling a considerable number of the electrical circuits.

Thus, in order to facilitate this frame-changing operation, the said box advantageously exhibits openings formed in its side faces and closeable by corresponding removable panels, and the said rigid frame is mounted secured to the said box, by its rear face, by fixing elements, accessible through the said openings. Thus, it is easy to carry out dismantling of the frame without touching the electrical circuits, by withdrawing the removable panels, then the fixing elements through the said openings, in order to refix a new frame. Advantageously, the said frame is extended, on its front face side, by lateral lugs which are capable of engaging in the said box by its rear face, in order to be fixed to the latter by the said fixing elements.

It will be noted that it is also possible to work on the interior of the said adaptor in order to check one or other of the electrical circuits, from one of the side faces of the box after having withdrawn the corresponding panel.

For preference, the said box consists of a rectangular framework cage delimiting the lateral front and rear openings, of removable side panels closing off the said lateral openings, and of a removable front panel, which carries the connectors of the said first set, closing off the said front opening, while the lateral lugs of the said rigid frame are inserted through the said rear opening of the said cage.

More particularly, the said rectangular framework cage is obtained from a metal sheet which is cut out at the sites intended to form the said openings, then bent and welded in order to constitute the said rigid cage, the latter then forming front and rear frames linked to one another by edges. The simplicity in production of the box will be noted, which, moreover, imparts considerable rigidity to it.

According to another characteristic of the invention, since the electrical connectors of the second set are accessible from the rear face of the frame, the interior of the box can be laid out as well as possible. In order to do that, the said electrical circuits may include at least one insulating printed circuit board arranged parallel to the said front and rear faces of the said box, and carrying intermediate electrical connectors between the electrical connectors of the said first and second sets. Fixing rails and the like may moreover be provided in the said rectangular framework cage making it possible, by intermediate pieces, to lay out the electrical circuits within the said box.

The figures of the attached drawing will give a good understanding of how the invention can be produced. In these figures, identical references designate similar elements.

Figure 1:
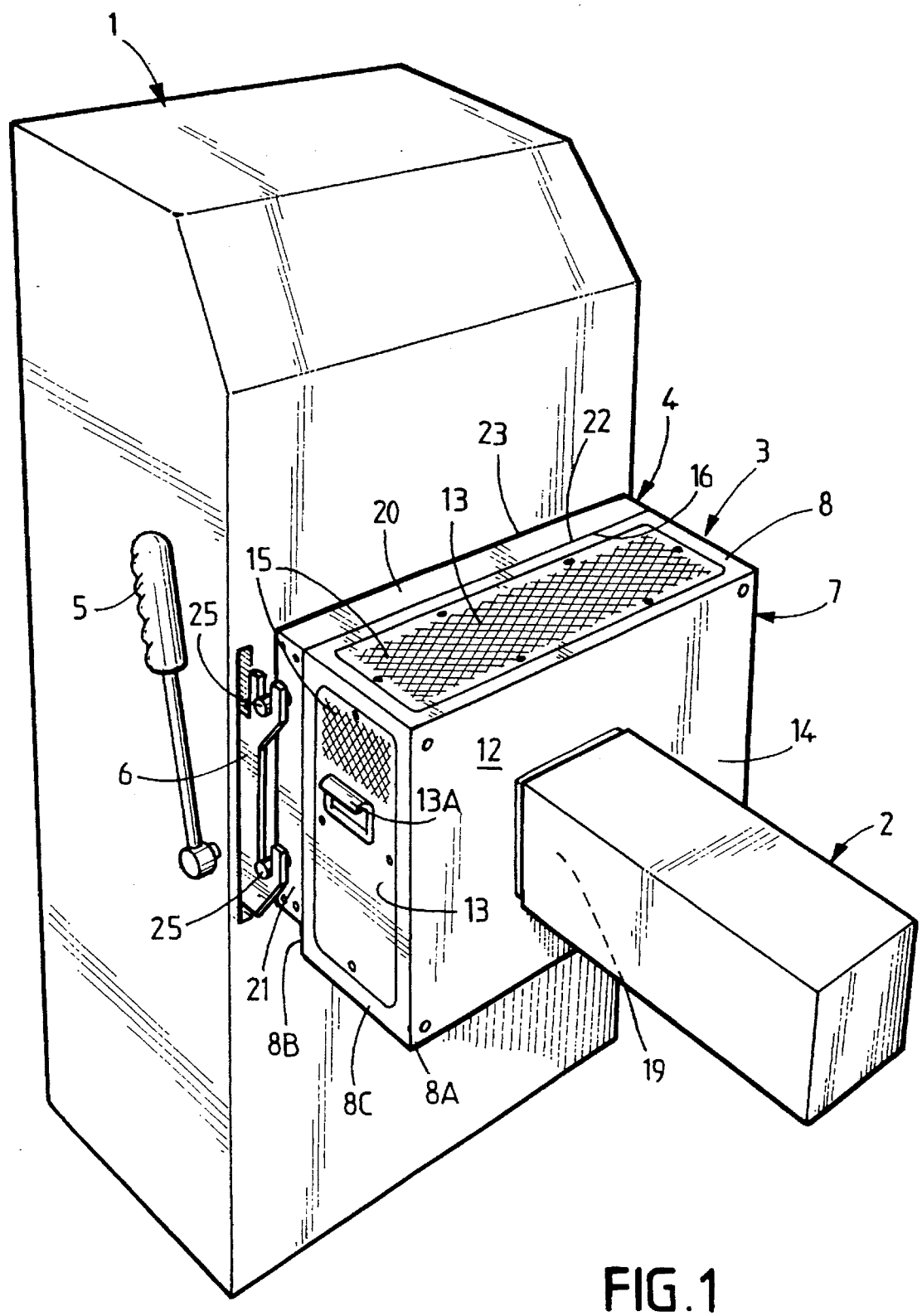
FIG. 1 shows, in perspective, electronic equipment to be tested mounted on a test machine, via an adaptor in accordance with the invention.

The machine 1 represented in perspective in FIG. 1 is intended to test electronic equipment 2, for example of the computer type. In order to do this, an interface adaptor 3 is provided, capable of being secured, removably, to the said machine 1 via a rigid frame 4, integral with the adaptor 3 and capable of interacting with a removable fixing mechanism carried by the said machine 1. In FIG. 1, only the actuating handle 5 and one of the two hooked levers 6 of this mechanism are visible. Such a fixing mechanism may be of any known type, for example that described in the U.S. Pat. No. 4,329,005.

As FIGS. 1 to 5 show, the interface adaptor 3 exhibits the form of a rectangular box 7, consisting of a rectangular framework cage 8 and of removable panels 12, 13 which close off five of the six openings 9, 10, 11 delimited by the said cage 8, and which are intended, at least partly, thus to form the faces of the said box 7. The framework cage 8 is, for example, obtained from a metal sheet in which the four side openings 11 are first of all cut out, and which is then bent in an appropriate way, then welded in order to form the said rectangular framework cage 8, with six openings. The cage then includes a rectangular front frame to which four struts 8A are firmly fixed, which delimit the front opening 9, and a rectangular rear frame, identical to the front frame and to which only one strut 8B is fixed, at its lower part, the latter delimiting the rear opening 10, together with the rear frame. The two front and rear frames of the cage 8 are linked to one another by the four edges 8C obtained during the bending of the sheet and arranged parallel to the depth of the cage 8, at the lateral corners of the latter. The four edges 8C then, with the front and rear frames, delimit the four side openings 11 of the cage.

Thus, the front face 14 of the box is constituted by the panel 12 and the struts 8A of the cage, the four side faces 15 of the box by the side panels 13 and the edges of the cage, while the rear face 16 of the box is constituted essentially by the rear frame of the cage and the strut 8B, which delimit the rear opening 10.

The front 12 and side 13 panels are assembled by fixing means, such as screws 17, to the struts and edges of the cage with the opening 8 and they moreover exhibit a plurality of through orifices 18 intended to provide a good circulation of air within the box of the adaptor while it is in use. Moreover, on the two opposite side panels, intended to be vertical when the adaptor is handled, respective handles 13A are provided.

Figure 2:
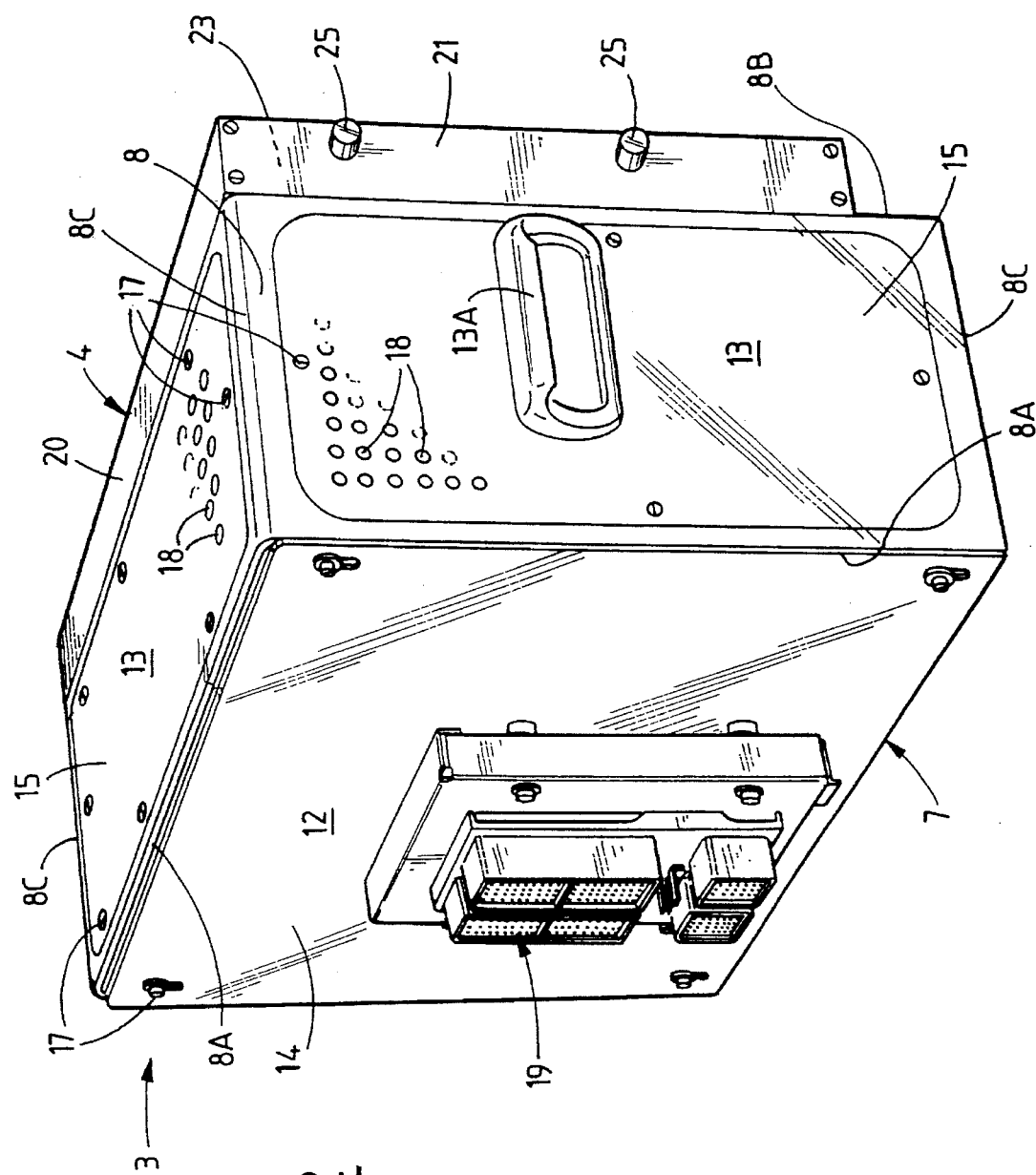
FIG. 2 is a view in perspective of the said adaptor from the front face of the said box.
Figure 3:
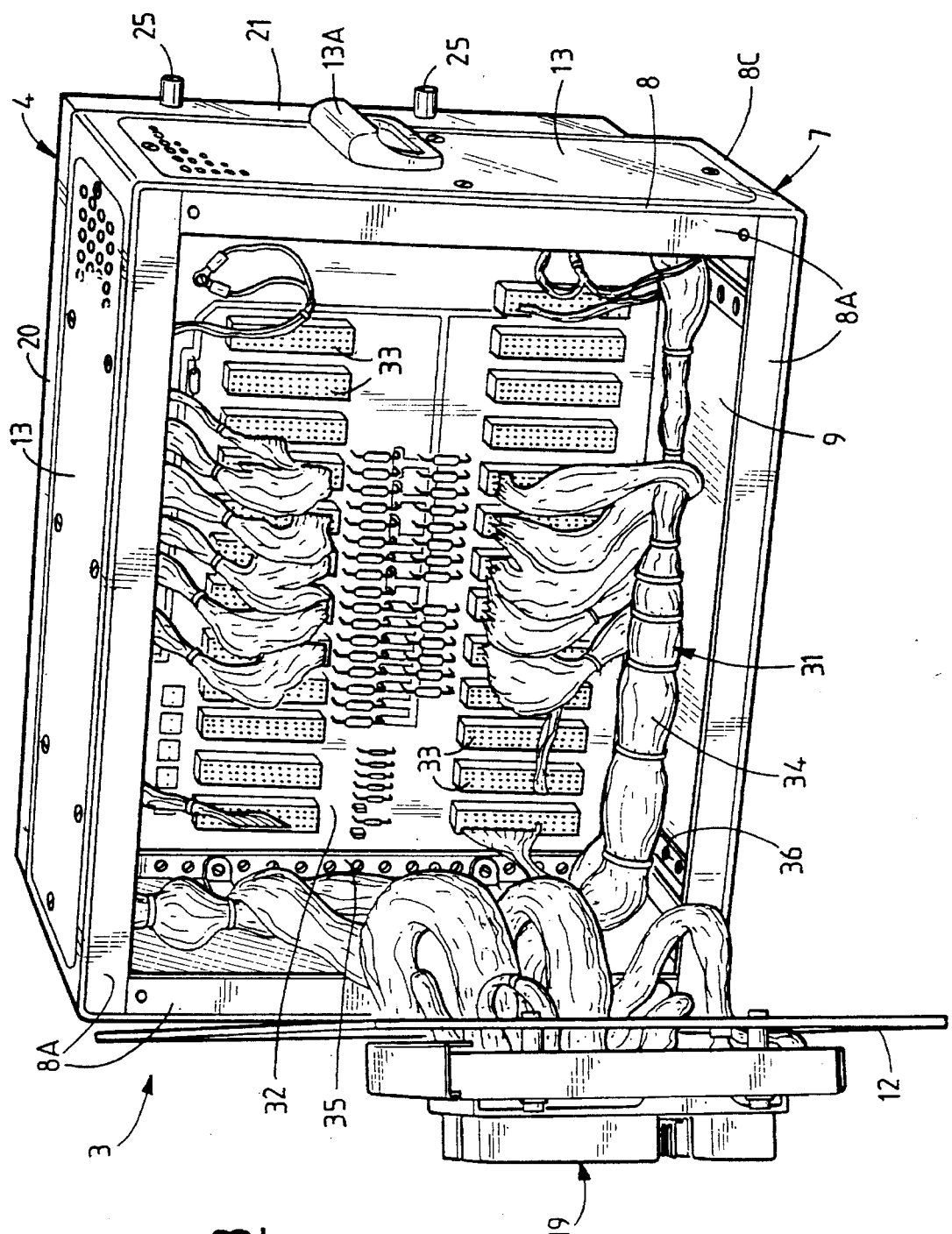
FIG. 3 is a view in perspective of the said adaptor with the front face of the said box, withdrawn, showing the various circuits and electrical links.

As can be seen in FIGS. 2 and 3, the front panel 12 carries, on its outer face, a first set of electrical connectors 19 intended to interact with complementary electrical connectors (not represented) carried by the rear face of the equipment 2 to be tested. The mounting of the equipment 2 onto the outer face of the front panel 12 is done by mating, so as to guarantee effective holding of the latter onto the adaptor.

Figure 6:
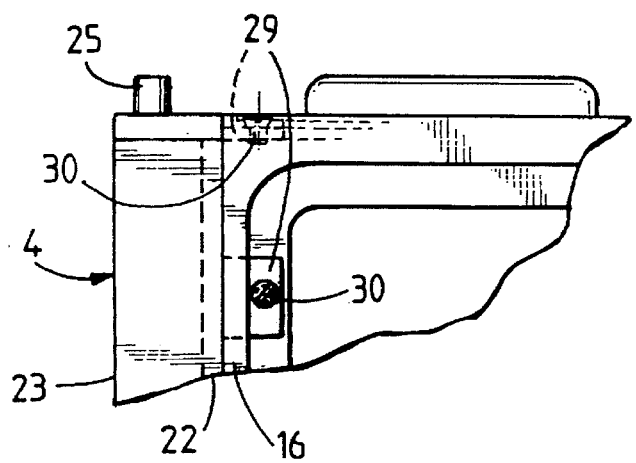
FIG. 6 is a partial top view, along the arrow F of FIG. 5, of the frame-box assembly.

The rigid frame 4 is fastened to the rear face 16 of the box, the frame consisting, in this embodiment example, of four struts 20, 21 assembled to one another and opposed parallel in pairs in order to form a rectangular configuration. These four struts, of substantially rectangular cross-section delimit, on one side, the front face 22 of the frame, intended to interact with the rear face 16 of the box 7 and, on the other side, the rear face 23 turned towards the said machine 1. As FIGS. 4 to 6 particularly show, the two struts which are opposite and, in this case, horizontal, 20, of the frame are identical and are intended to carry the second set of electrical connectors 24. As for the other two struts which are opposite and, then, vertical, 21, they are identical and each externally carry two projecting cylindrical bushes 25 for hooking with the respective levers 6 of the removable locking mechanism of the said machine 1.

Figure 4:
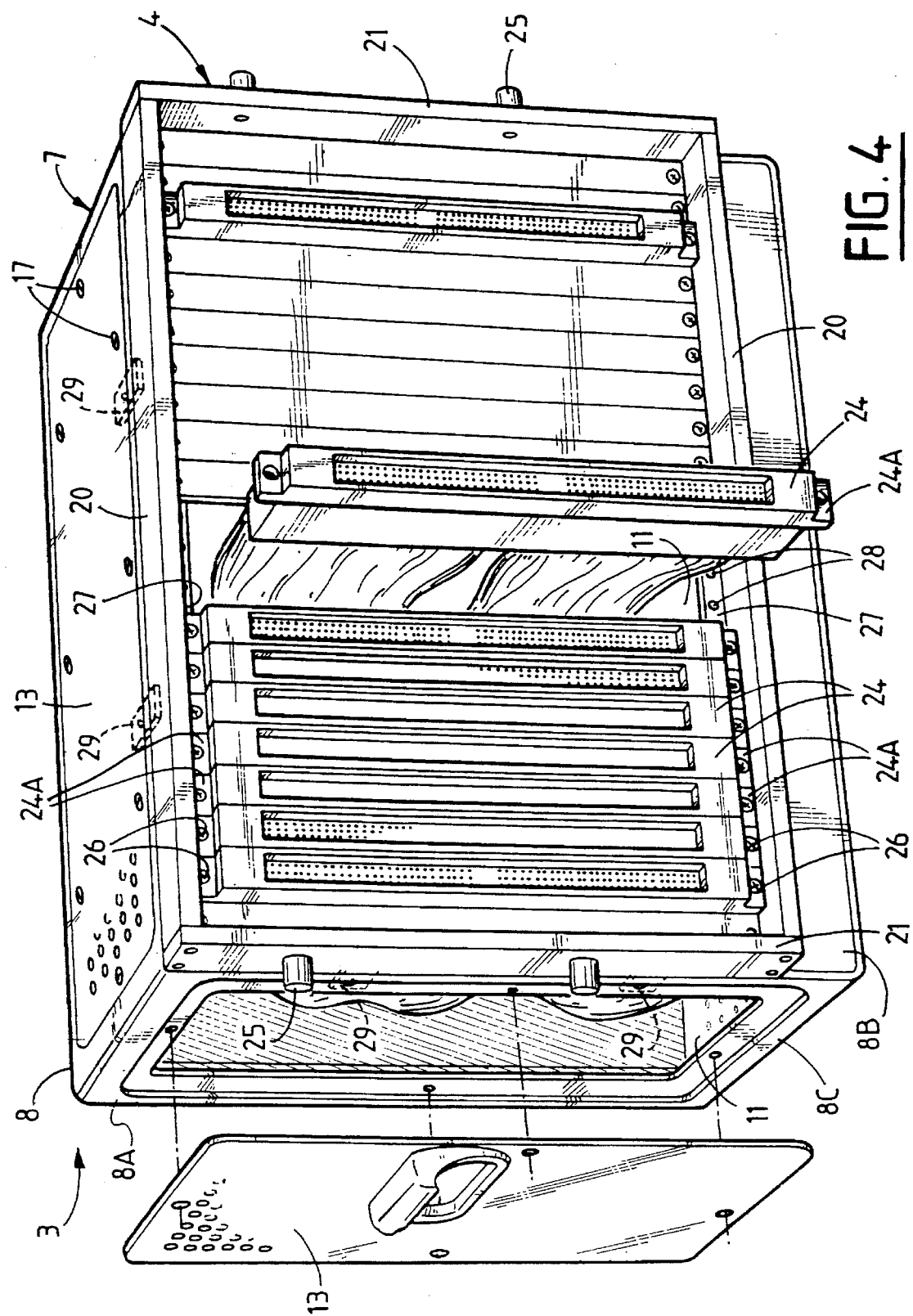
FIG. 4 is a view in perspective of the said adaptor from the rear face of the said frame, showing the access to the corresponding connectors through the said frame.
Figure 5:
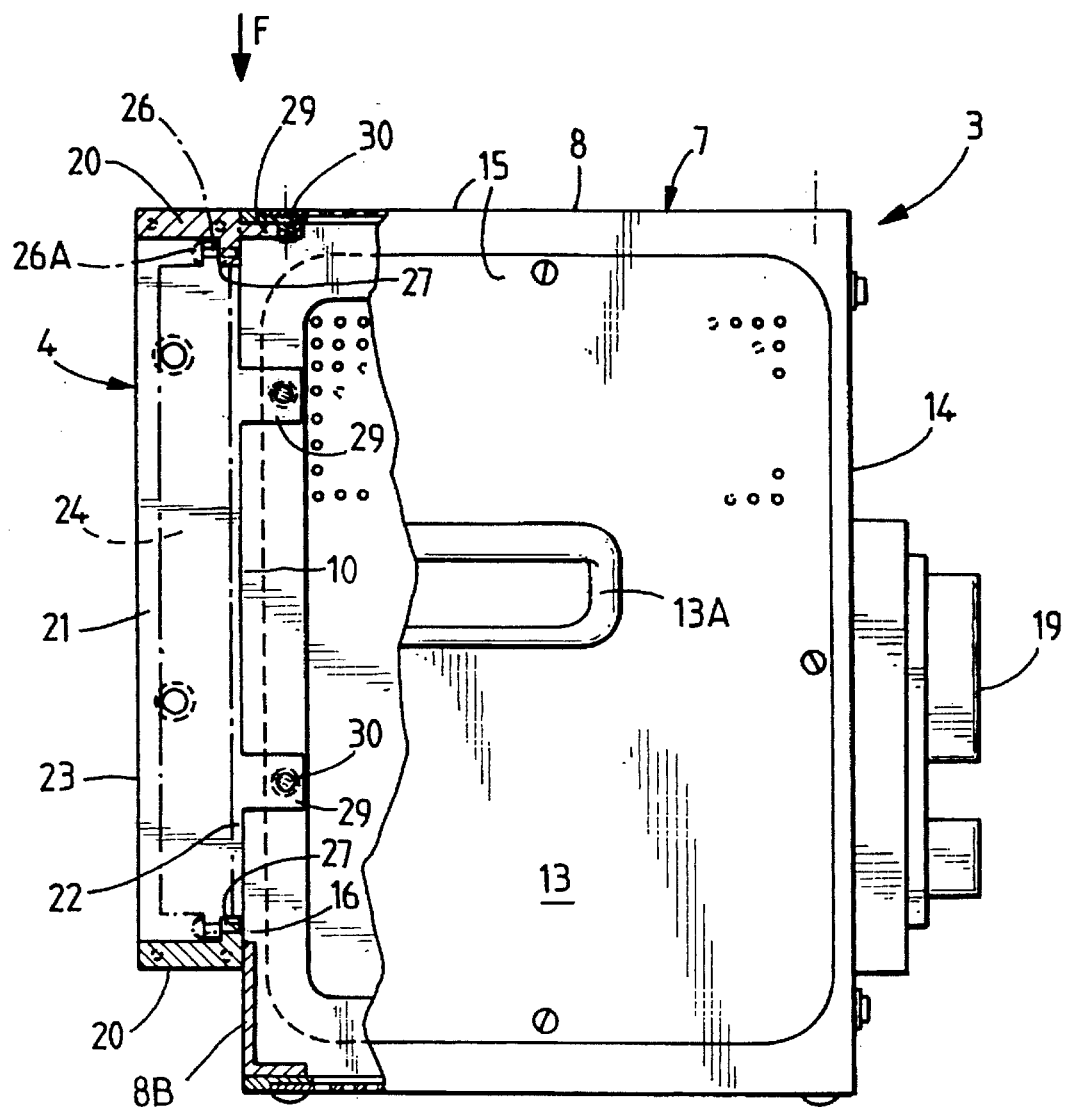
FIG. 5 is a side view, in partial section, of the said adaptor, particularly showing the fixing of the rigid frame to the said box.

Advantageously, the electrical connectors 24 of the second set are mounted on the adaptor in order to be able to be put in place on or separated from the box 7 through the said rigid frame 4. In order to do that, they are fixed on the front face 22 of the frame by fixing screws 26 the heads 26A of which are accessible from the rear face 23 of the frame, which then makes it possible to carry out maintenance of the connectors without having to dismantle the frame 4 from the box 7 in order to gain access to the connectors. In order to do this, as FIGS. 4, 5 and 6 more particularly show, the two opposite struts 20 of the frame are provided, on the front face 22 side, with respective inner rims 27 turned towards one another and pierced by a plurality of tapped holes 28. As the connectors 24 are identical, and, in this case, rectangular, the tapped holes are equidistant from one another. Thus, the ends 24A of the connectors are applied against the inner rims 27 of the struts 20, after having been introduced from the rear face 23 of the frame, in order to be fixed there by the screws 26 engaging in the tapped holes 28 of the said struts, while their heads 26A are applied against the ends 24A of the said connectors. Once mounted, the connectors 24 are arranged parallel with respect to one another, as FIG. 4 shows. On the latter, one of the electrical connectors 24 is represented in extracted position, out of the box 7, achieved by simple unscrewing of the screws 26 through the rear face 23 of the frame. Thus, various maintenance operations can be carried out on this connector.

Moreover, the fixing of the rigid frame 4 to the box 7, which is also rigid by virtue of its cage 8, is done by means of lateral lugs 29 extending the struts of the frame and engaging in the box through its rear face 16, and of fixing elements 30. More particularly, at least two lugs, spaced from one another, are provided on each of the struts 21, vertical in the figures, and on the upper horizontal strut 20, so that they project with respect to the front face 22 of the frame. These lugs 29 engage through the rear opening 10 of the rear frame of the box, in order to be arranged under the side faces of the framework cage, which delimit the openings 11. And the fixing elements 30, such as countersunk-head screws, are mounted from the outside of the cage, in order to be screwed into the lugs and thus to fix the frame to the box. The mounting and the dismantling of the frame from the box is done easily after having withdrawn the removable side panels 13 from the said box, which is particularly convenient when it is necessary to change the frame when the anchoring bushes 25 are worn.

Moreover, by virtue of the mounting of the electrical connectors 24 on the rigid frame 4 by its rear face, it is possible to lay out the inside of the adaptor 3 and especially of box 7, so as to present the electrical circuits 31 to best advantage. In order to do that, the latter include, for example, an insulating printed circuit board 32 arranged within the box 7, parallel to its front 14 and rear 16 faces, that is to say to the front and rear frames of the cage 8. This insulated printed circuit board 32 is equipped particularly with intermediate electrical connectors 33 linking the electrical connectors 19 and 24 respectively of the first and second sets. As FIG. 3 shows, it is then possible to arrange to best advantage the routing of the various electrical links 34, configured into harnesses, in order thus to facilitate maintenance of the adaptor 3. In this figure, the front panel 12, carrying the first set of connectors, has been withdrawn from the cage 8. The insulated printed circuit board 32 can be held within the latter by intermediate pieces such as vertical and horizontal rails 35, which are fixed to rails 36 provided on the framework cage of the box.

We claim:

1. Adaptor for a machine for testing electronic equipment, designed to serve as interface between the machine and the equipment and being presented in the form of an at least approximately rectangular box, the adaptor comprising:

a first set of electrical connectors arranged on a front face of the box and adapted to interact with a number of complementary electrical connectors carried by the equipment;

a second set of electrical connectors arranged on a rear face of the box and adapted to interact with a number of complementary electrical connectors carded by the machine;

electrical circuits housed in the box and establishing electrical links between the first and second sets of connectors; and a rigid frame, integral with the box at a periphery of the rear face of the box, and adapted to interact with a mechanism provided on the machine for removably fixing the box onto the machine, by the rear face, the electrical connectors of the second set being mounted so as to be able to be put in place on the box and to be separated from the box, through the rigid frame, wherein the rigid frame comprises four struts disposed in parallel pairs, the connectors of the second set being applied at their ends against two of the opposite struts of the frame in order to be fixed there, and wherein the other opposite struts of the frame are identical and are provided externally with projecting anchoring bushes adapted to interact with a removable locking mechanism of the machine.

2. Adaptor according to claim 1, wherein the electrical connectors of the second set are fixed onto a front face of the rigid frame by fixing screws or the like, having heads which are accessible from a rear face of the frame.

3. Adaptor according to claim 1, wherein the opposite struts of the frame carrying the connectors of the second set, are identical and are provided with respective inner alms situated on the front face of the frame and turned towards one another, the connectors being brought into abutment against the inner rims from the rear face of the frame, in order to be fixed there.

4. Adaptor according to claim 1, wherein the electrical circuits include at least one insulating printed circuit board arranged parallel to the front and rear faces of the box, and carrying intermediate electrical connectors between the electrical connectors of the first and second sets.

5. Adaptor according to claim 1, wherein fixing rails are provided in the rectangular framework cage making it possible, by intermediate pieces, to lay out the electrical circuits within the box.

6. Adaptor for a machine for testing electronic equipment, designed to serve as interface between the machine and the equipment and being presented in the form of an at least approximately rectangular box, the adaptor comprising:

a first set of electrical connectors arranged on a front face of the box and adapted to interact with a number of complementary electrical connectors carried by the equipment;

a second set of electrical connectors arranged on a rear face of the box and adapted to interact with a number of complementary electrical connectors carried by the machine;

electrical circuits housed in the box and establishing electrical links between the first and second sets of connectors; and a rigid frame, integral with the box at a periphery of the rear face of the box, and adapted to interact with a mechanism provided on the machine for removably fixing the box onto the machine, by the rear face, the electrical connectors of the second set being mounted so as to be able to be put in place on the box and to be separated from the box, through the rigid frame, wherein the box has openings formed in its side faces which are closeable by corresponding removable panels and wherein the rigid frame is mounted secured to the box, by its rear face, by fixing elements accessible through the openings.

7. Adaptor according to claim 6, wherein the frame is extended, on a front face, by lateral lugs which are capable of engaging in the box by a rear face, in order to be fixed to the latter by the fixing elements.

8. Adaptor according to claim 7, wherein the box comprises a rectangular framework cage delimiting lateral front and rear openings, of removable side panels closing off the lateral openings, and of a removable front panel, which carries the connectors of the first set, closing off the front opening, while the lateral lugs of the rigid frame are inserted through the rear opening of the cage.

9. Adaptor according to claim 8, wherein the rectangular framework cage is formed from a metal sheet which is cut out at the sites intended to form the openings, then bent and welded in order to constitute the rigid cage, the latter then forming front and rear frames linked to one another by edges.

* * * * *

UNITED STATES PATENT AND TRADEMARK OFFICE
CERTIFICATE OF CORRECTION

PATENT NO. : 5,562,505

DATED : October 8, 1996

INVENTOR(S) : FRENEUIL et al.

It is certified that error appears in the above-identified patent and that said Letters Patent is hereby corrected as shown below:

On title page,

Item [73] Assignee: Societe Nationale Industrielle et Aerospatiale should be --Aerospatiale Societe Nationale Industrielle--

Signed and Sealed this

Twentieth Day of May, 1997

Attest:

BRUCE LEHMAN

Attesting Officer

Commissioner of Patents and Trademarks